(12) United States Patent
Kumar et al.

(10) Patent No.: US 8,780,655 B1
(45) Date of Patent: Jul. 15, 2014

(54) METHOD AND APPARATUS FOR ALIGNING A CLOCK SIGNAL AND A DATA STROBE SIGNAL IN A MEMORY SYSTEM

(71) Applicant: ARM Limited, Cambridge (GB)

(72) Inventors: Nidhir Kumar, Bangalore (IN); Gyan Prakash, Bangalore (IN); Chandrashekar Narla, Bangalore (IN)

(73) Assignee: ARM Limited, Cambridge (GB)

( * ) Notice: Subject to any disclaimer, the term of this patent is extended or adjusted under 35 U.S.C. 154(b) by 15 days.

(21) Appl. No.: 13/726,392

(22) Filed: Dec. 24, 2012

(51) Int. Cl.
*G11C 7/00* (2006.01)

(52) U.S. Cl.
USPC .................. 365/194; 365/193; 365/233.1

(58) Field of Classification Search
USPC ............... 365/194, 193, 233.1, 233.5, 233.11
See application file for complete search history.

(56) References Cited

U.S. PATENT DOCUMENTS

| | | | |
|---|---|---|---|
| 7,036,053 B2 | 4/2006 | Zumkehr et al. | |
| 7,111,111 B2 | 9/2006 | Neuman et al. | |
| 7,165,185 B2 | 1/2007 | Li et al. | |
| 7,886,174 B2 | 2/2011 | Spry et al. | |
| 8,037,375 B2 | 10/2011 | Schaefer | |
| 8,295,118 B2 * | 10/2012 | Best et al. .................. | 365/233.1 |
| 2007/0002642 A1 | 1/2007 | Butt et al. | |
| 2008/0276133 A1 | 11/2008 | Hadley et al. | |
| 2010/0246290 A1 | 9/2010 | MacLaren et al. | |
| 2011/0040902 A1 | 2/2011 | Housty | |
| 2011/0078370 A1 | 3/2011 | Chaudhuri et al. | |
| 2011/0128793 A1 | 6/2011 | Venkataraman et al. | |

OTHER PUBLICATIONS

U.S. Appl. No. 13/726,395, filed Dec. 24, 2012, Kumar et al.
U.S. Appl. No. 13/726,383, filed Dec. 24, 2012, Prakash et al.
U.S. Appl. No. 13/854,226, filed Apr. 1, 2013, Prakash et al.
U.S. Appl. No. 13/861,641, filed Apr. 12, 2013, Prakash et al.
"JESD79-3F (Revision of JESD79-3E, Jul. 2010)", DDR3 SDRAM Standard, (Jul. 2012), 226 pages.
P. Fleming et al, "Algorithm for Adjustment of DDR Write Interface Timing" ISSC 2008, Jun. 2008, pp. 144-148.

* cited by examiner

*Primary Examiner* — David Lam
(74) *Attorney, Agent, or Firm* — Nixon & Vanderhye P.C.

(57) ABSTRACT

A method of aligning a clock signal and a data strobe signal in a system comprising a memory controller and a memory, and a corresponding memory system are provided. The method comprising the steps of: putting the memory into a write levelling mode; incrementing an alignment delay applied to the data strobe signal until a transition point occurs at which a response of the memory to issuance of the data strobe signal transitions to an inverse state; performing an oversampling of the response of the memory over a selected interval following said transition point; repeating the steps of incrementing and performing an oversampling until, for a selected alignment delay, a majority of results of the oversampling is in the inverse state; performing a cycle alignment detection procedure to determine an identified clock cycle of a plurality of adjacent cycles of the clock signal, the identified clock cycle responsible for the transition point; and applying the selected alignment delay to the data strobe signal and applying a clock cycle selection to a data path in the system to match the identified clock cycle.

19 Claims, 16 Drawing Sheets

METHOD AND APPARATUS FOR ALIGNING A CLOCK SIGNAL AND A DATA STROBE SIGNAL IN A MEMORY SYSTEM

This application incorporates by reference the subject matter disclosed in each of the concurrently filed applications entitled "An Interface For Controlling The Phase Alignment Of Clock Signals For A Recipient Device" by Gyan Prakash et al (Ser. No. 13/726,383) and "A data signal receiver and method of calibrating a data signal receiver" by Nidhar Kumar et al (Ser. No. 13/726,395).

BACKGROUND OF THE INVENTION

1. Field of the Invention

The present invention relates to a method and apparatus for aligning a clock signal and a data strobe signal in a system comprising a memory controller and a memory. More particularly, this invention relates to determining a delay applied to the data strobe signal to align it with the clock signal.

2. Description of the Prior Art

In a memory system comprising a memory controller and a memory, it is known for the memory controller to carry out a write levelling calibration of the memory system during an initiation phase in which the relative timing of a clock signal (CLK) and a data strobe signal (DQS) is adjusted. The clock signal is distributed by the memory controller to the memory modules of the memory system as a reference for all components of the system and the data strobe signal indicates the points at which a data signal (DQ) transmitted between the memory controller and the memory modules should be sampled.

As contemporary memory systems, in particular dual data rate systems, progress to ever higher clock rates and data transfer rates, the challenges presented in carrying out this write levelling process are growing. The corresponding JEDEC specification (JESD79-3E) defines a basic process for alignment correction between DQS and CLK for up to one clock cycle under ideal conditions. However, this mechanism has now been found not to be practical in contemporary systems (in particular at the above mentioned high data rates) where system jitter and write levelling uncertainty (tWLH, tWLH) are present. Moreover, contemporary memory systems such as DDR3 memory systems adopt a fly-by signal routing for the clock and command (CLK/CMD) signals transmitted from the memory controller to the memory modules, wherein the CLK/CMD signals are routed from one memory module to the next in a concatenated chain. Whilst this improves the signal quality due to an avoidance of the reflection inherent in a branched topology, it also necessarily increases the CLK/CMD path length for memory modules later in the concatenation. In particular some dual in-line memory module (DIMM) topologies operating at data rates greater than 1600 Mb/s will require more than one clock cycle of write levelling and have stringent clock jitter requirements. The DQS path in PHY (i.e. on the memory controller) is typically rather long and the dynamic random access memory (DRAM) clock path is usually matched to the DQS path on chip. However, increasing the length of the DRAM clock path, whilst on the one hand allowing it to provide the required degree of write levelling, on the other hand also makes it more susceptible to power supply noise induced jitter, unless built using current mode logic (CML) which typically has undesirably high power requirements and further requires custom implementation.

Accordingly it would be desirable to provide a method and apparatus for allowing the required write levelling to be carried out whilst further satisfying the contemporary stringent clock jitter requirements.

SUMMARY OF THE INVENTION

Viewed from a first aspect, the present invention provides a method of aligning a clock signal and a data strobe signal in a system comprising a memory controller and a memory, the method comprising the steps of:

putting said memory into a write levelling mode;

incrementing an alignment delay applied to said data strobe signal until a transition point occurs at which a response of said memory to issuance of said data strobe signal transitions to an inverse state;

performing an oversampling of said response of said memory over a selected interval following said transition point;

repeating said steps of incrementing and performing an oversampling until, for a selected alignment delay, a majority of results of said oversampling is in said inverse state;

performing a cycle alignment detection procedure to determine an identified clock cycle of a plurality of adjacent cycles of said clock signal, said identified clock cycle responsible for said transition point; and applying said selected alignment delay to said data strobe signal and applying a clock cycle selection to a data path in said system to match said identified clock cycle.

The present invention provides an improved technique for performing write levelling in the memory system. Firstly, the system offers an improved technique for identifying the edge alignment between the clock signal and the data strobe signal by performing an oversampling of a selected interval following an identified transition point at which the response of the memory to issuance of the data strobe signal transitions to a inverse state. The system jitter could mean that the edge alignment between the clock signal and the data strobe signal could be wrongly identified, in particular in the typical configuration where a rising edge is searched for, a rising edge could be wrongly identified by system jitter producing the 0-to-1 transition as an artefact of the instability present. However, oversampling a selected interval (for example a quarter clock cycle) following a candidate rising edge enables the rising edge to be verified by virtue of a majority of the oversampling resulting in a 1 rather than a 0 (in the example where a rising edge is searched for). Secondly, the present technique further provides the ability for the edge alignment between the clock signal and the data strobe signal to be performed such that the particular clock cycle responsible for the identified transition point can be determined. Advantageously, this enables the clock signal to data strobe signal edge relation to be determined across multiple clock cycles. Hence multiple clock cycles of skew between the clock signal and the data strobe signal can be adapted for without resorting to the above-described additional delay components added to the clock path and the additional system jitter which these could introduce.

In some embodiments the method further comprises a clock path reduction step, said clock path reduction step comprising amending a clock path which carries said clock signal to reduce a delay inherent in propagating said clock signal along said clock path. Where previously a clock path would typically be provided which was matched (in timing) to a data strobe path, the present techniques enable the clock path to be amended such that delay components provided to match the clock path to the data strobe path can be removed, thus reducing system jitter resulting from the presence of those components.

It will be appreciated that this clock path reduction step could be carried out in a number of ways, but in one embodiment said clock path reduction step comprises removing selected components from said clock path, wherein said selected components have matching counterparts on a data strobe path which carries said data strobe signal. For example, the memory system may be provided in a format in which these components are already provided on the clock path and in this situation the method may comprise removing one or more selected components from the clock path.

In another embodiment said clock path reduction step comprises enabling one of a plurality of alternative routes for said clock path. For example, the memory system may be provided in a configuration where a "matched" clock path and a "non-matched" clock path are provided with the ability to select between the two for example provided by a multiplexer. In such a situation, when carrying out the present techniques, this step comprises selecting the non-matched clock path.

It will be appreciated that the oversampling may be configured in a number of different ways, but in some embodiments the selected internal for the oversampling is a quarter clock cycle. Further, in some embodiments a number of samples taken in said oversampling is a user programmable value.

In some embodiments the method further comprises an average alignment delay determination step, said average alignment delay determination step comprising iteratively re-determining said transition point and calculating an average alignment delay. Due to the presence of system jitter, it is advantageous if the alignment delay is not merely determined on the basis of a single identification of the transition point, but rather where multiple iterations of determining the transition point are made, thus allowing an average alignment delay to be calculated. In some embodiments the average alignment delayed determination step comprises a user programmable number of iterations. Accordingly, in dependence on the user's expectation or experience of the degree of system jitter present, the averaging process can be adapted accordingly.

In some embodiments the iteratively re-determining said transition point comprises alternate phases of:

i) increasing said alignment delay to identify said transition point at which said response of said memory to issuance of said data strobe signal transitions to said inverse state; and ii) decreasing said alignment delay to identify said transition point at which said response of said memory to issuance of said data strobe signal transitions to an inverse of said inverse state.

In this manner the iterative redetermination of the transition point may be efficiently carried out by this two phase process of increasing the alignment delay to determine the transition point in one direction and decreasing the alignment delay to identify the transition point in the opposite direction (in which the memory response will transition in the opposite direction, i.e. 1-to-0 where the original transition was 0-to-1).

In some embodiments said alignment delay is not reset between said alternate phases. Accordingly, rather than performing a full sweep of the alignment delay in order to identify the transition point the alignment delay can advantageously be swept backwards and forwards over a shorter range in order to allow each iteration of the averaging process to be more quickly completed.

In some embodiments, if said phase of increasing said alignment delay reaches a maximum alignment delay without said transition point being identified then said iteratively re-determining said transition point is determined to have failed. For example, the maximum alignment delay may correspond to a full clock cycle and in this situation if the alignment delay has been swept through a full clock cycle without finding the transition point then an error has occurred and the iterative determination of the transition point is determined to have failed.

In some embodiments, if said phase of decreasing said alignment delay reaches a minimum alignment delay without said transition point being identified, then a current iteration of iteratively re-determining said transition point is retried. For example a minimum alignment delay may be zero delay and if the phase of decreasing the alignment delay reaches zero delay then a problem has occurred with the current iteration of the averaging process and this iteration may be retried.

In some embodiments a limit on the number of retries for an iteration may be imposed and if a number of retried iterations exceeds a predetermined proportion of a number of successful iterations of said average alignment delay determination step, said average alignment delay determination step is determined to have failed. This enables the determination of the transition point to be more reliably determined by basing the averaging calculation on a set of successful iterations of the averaging process. For example, an upper limit of 10% may be imposed as the number of iterations requiring retry allowed in the averaging count.

In the situation where this failure occurs, in some embodiments if said average alignment delay determination step is determined to have failed, said average alignment delay determination step is reinitiated after adding an offset to said alignment delay. For example, three quarter of a clock cycle may be added to the alignment delay to shift the position at which the alignment is being attempted to a new section of the clock cycle.

In some embodiments said cycle alignment detection procedure comprises iteratively masking clock cycles of said plurality of adjacent cycles to determine said identified clock cycle which is responsible for said transition point on the basis of a change in said response of said memory. Hence a particular clock cycle may be identified which is responsible for the transition point by identifying the masking which resulted in a change in the response of the memory.

In some embodiments said cycle alignment detection procedure comprises adding a partial clock cycle to said selected alignment delay prior to iteratively masking said clock cycles. This partial clock cycle may for example be a ¼ clock cycle and helps to ensure that the data strobe signal does not violate the write levelling setup/hold time during the cycle alignment detection procedure.

In some embodiments said cycle alignment detection procedure comprises comparing said selected alignment delay to a user defined threshold and determining said identified clock cycle based on a result of said comparing. Some memory systems may not allow clock masking (e.g. Registered DIMM (RDIMM) systems). In this situation on completion of write levelling (i.e. edge alignment) and determination of the alignment delay if any alignment delay is less than a previously determined alignment delay by a user defined threshold (based on expected delay from chip to chip and average system jitter) then a digital delay of one cycle may be added in the write data path to produce the required write levelling.

In some embodiments said applying said clock cycle selection to said data path to match said identified clock cycle comprises selecting between a plurality of differently timed enable signals. In particular, integer clock cycle timing differences between the enable signals provides a mechanism for offsetting the data path timing by a selected number of clock cycles.

In some embodiments said memory is a DDR3 memory system.

In some embodiments said memory comprises multiple memory modules wherein a clock path which carries said clock signal to said multiple memory modules is configured in a fly-by configuration.

Viewed from a second aspect the present invention provides a computer program product storing in a non-transient fashion a computer program configured to cause the execution of the method of the first aspect.

Viewed from a third aspect the present invention provides apparatus comprising a memory controller and a memory, the apparatus comprising:

a control unit configured to put said memory into a write levelling mode;

an alignment delay determination unit configured to increment an alignment delay applied to said data strobe signal until a transition point occurs at which a response of said memory to issuance of said data strobe signal transitions to an inverse state;

an oversampling unit configured to perform an oversampling of said response of said memory over a selected interval following said transition point, said alignment delay determination unit and said oversampling unit configured to repeat said incrementing and performing an oversampling until, for a selected alignment delay, a majority of results of said oversampling is in said inverse state; and a cycle alignment detection unit configured to perform a cycle alignment detection procedure to determine an identified clock cycle of a plurality of adjacent cycles of said clock signal which is responsible for said transition point, wherein said control unit is configured to apply said selected alignment delay to said data strobe signal and to apply a clock cycle selection to a data path to match said identified clock cycle.

Viewed from a fourth aspect the present invention provides apparatus comprising a memory controller and a memory, the apparatus comprising:

control means for putting said memory into a write levelling mode;

alignment delay determination means for incrementing an alignment delay applied to said data strobe signal until a transition point occurs at which a response of said memory to issuance of said data strobe signal transitions to an inverse state;

oversampling means for performing an oversampling of said response of said memory over a selected interval following said transition point means configured to repeat said incrementing and performing an oversampling until, for a selected alignment delay, a majority of results of said oversampling is in said inverse state; and cycle alignment detection means for performing a cycle alignment detection procedure to determine an identified clock cycle of a plurality of adjacent cycles of said clock signal which is responsible for said transition point, wherein said control means is configured to apply said selected alignment delay to said data strobe signal and to apply a clock cycle selection to a data path to match said identified clock cycle.

BRIEF DESCRIPTION OF THE DRAWINGS

The present invention will be described further, by way of example only, with reference to embodiments thereof as illustrated in the accompanying drawings, in which.

DESCRIPTION OF THE PREFERRED EMBODIMENTS

Figure 1:
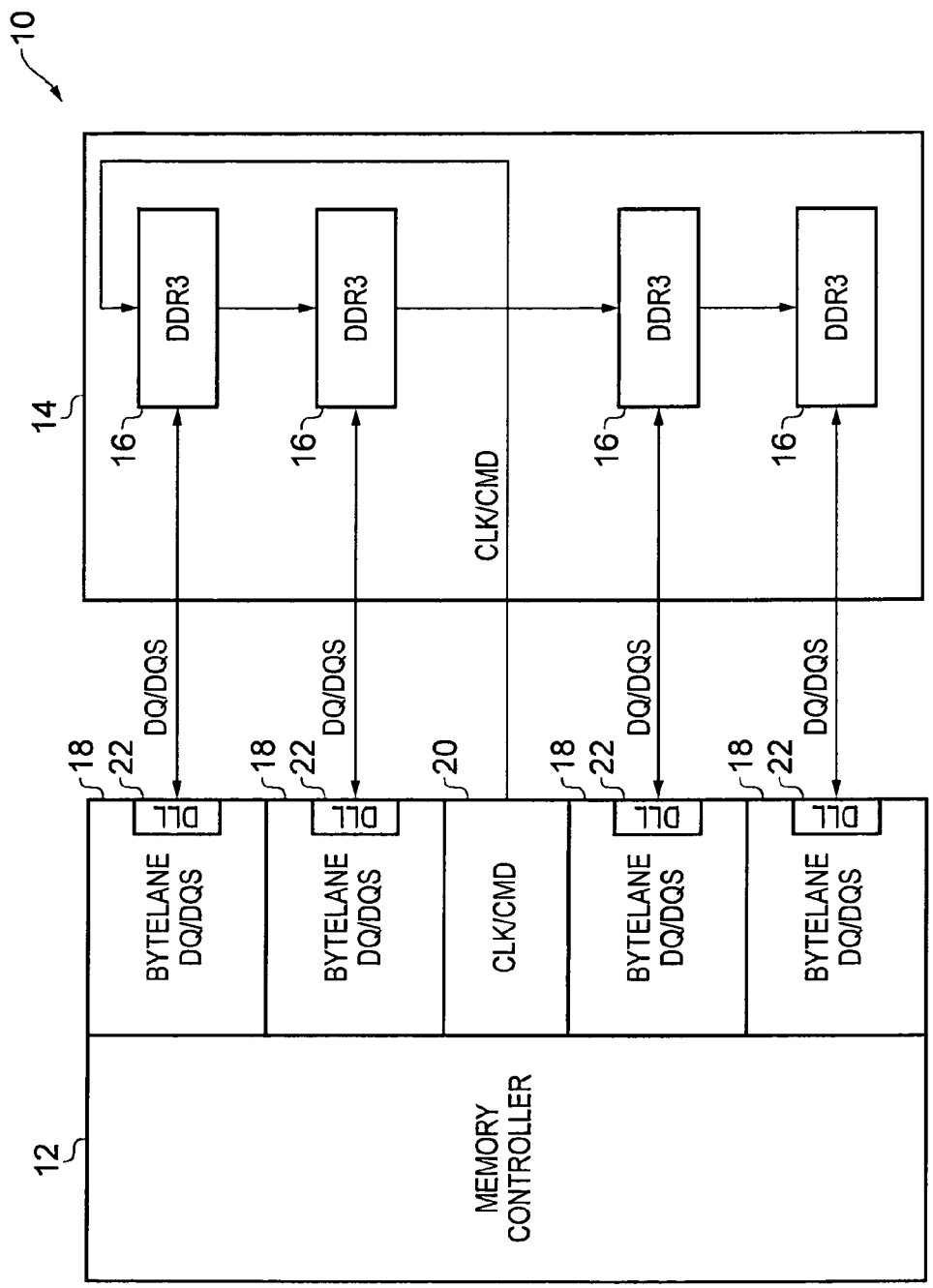
FIG. 1 schematically illustrates a dual data rate DRAM system in which a memory controller controls access to four DDR3 modules in one embodiment.

FIG. 1 schematically illustrates a DDR memory system 10, which generally comprises a memory controller integrated circuit 12 and a memory module integrated circuit 14. The memory module integrated circuit 14 comprises four DDR3 modules 16, each of which may be accessed in parallel by its own dedicated bytelane 18 provided as part of the memory controller integrated circuit 12. The memory controller integrated circuit 12 further comprises a clock/command (CLK/CMD) module 20 which is configured to transmit clock and command signals to the DDR3 modules 16. In the illustrated embodiment shown in FIG. 1, the CLK/CMD signals are transmitted between the DDR3 modules in a "fly-by" configuration to improve signal integrity (avoiding the reflections associated with a branching topology). Accordingly, the memory controller 12 can cause data to be read from one of the DDR3 modules 16 by issuing appropriate command (CMD) signals via the CLK/CMD path (in association with the clock signal CLK which is also transmitted via that route), the requested data being returned from the corresponding DDR3 module via its associated DQ/DQS path to the corresponding bytelane 18 of the memory controller 12. Equally, the memory controller 12 can cause data to be written to one of the DDR3 modules 16 by issuing appropriate command (CMD) signals via the CLK/CMD path, the write data being transmitted from the respective bytelane 18 of the memory controller 12 to the corresponding DDR3 module via its associated DQ/DQS path.

In a write configuration, in order for the DDR3 modules to be able to correctly interpret the data transmitted as the DQ signal, it is necessary for the relative timing of the DQS signal to be correctly calibrated, since the data strobe signal DQS indicates the sample points at which the DQ signal should be sampled. Each bytelane further comprises a set of delay-locked loop (DLL) logic 22 enabling these relative timings to be adjusted under the overall control of the memory controller 12.

Figure 2:
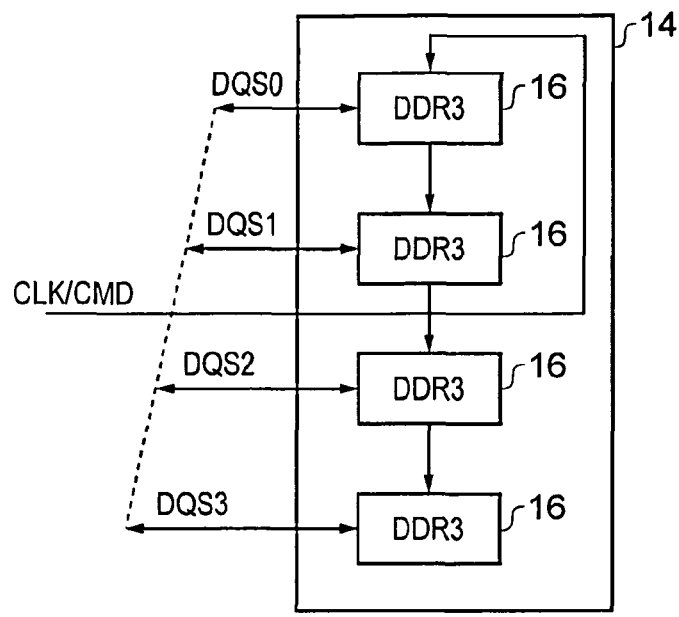
FIG. 2 schematically illustrates how the fly-by configuration of the CLK/CMD path in the memory system shown in FIG. 1 results in a range of timing offsets between CLK and DQS for the different DQS paths.

FIG. 2 schematically illustrates how the fly-by topology used for the command/clock (CLK/CMD) signalling results in a range of timing offsets between the clock signal CLK and the respective data strobe signals DQS0, DQS1, DQS2 and DQS3.

Figure 3:
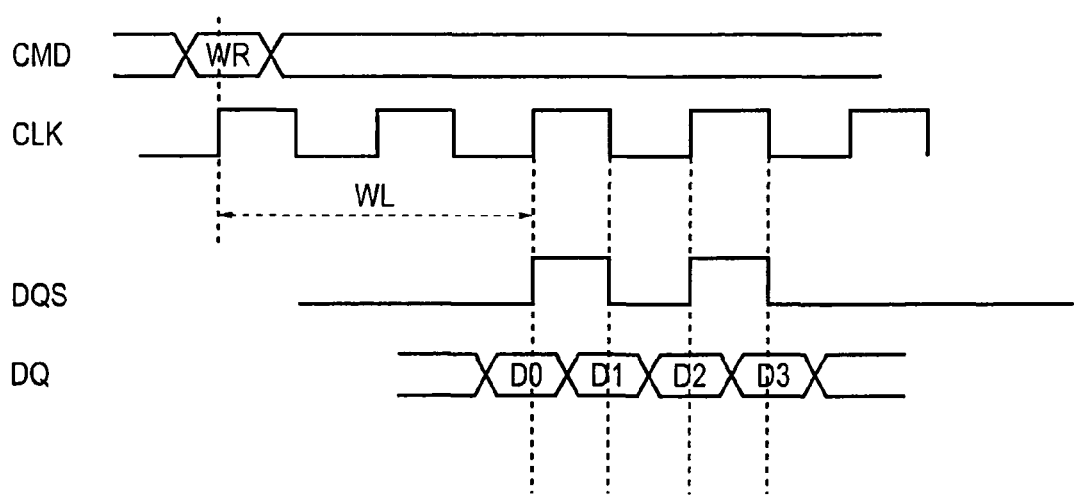
FIG. 3 illustrates the relative timing of CMD, CLK, DQS and DQ signals in an example write configuration.

FIG. 3 shows a timing overview of the general DDR write process in which a write command (WR) is first registered, followed by receiving data (DQ) on both the rising and falling edges of the data strobe signal (DQS). The data DQ is transmitted from the memory controller to the DDR modules after a write latency (WL) delay. In order for the write data to be correctly received by the DDR modules, it is necessary for the respective DQS signal to be correctly aligned with the DQ data eye, which in turn requires the DQS and clock signals to be correctly aligned with one another.

Figure 4A:
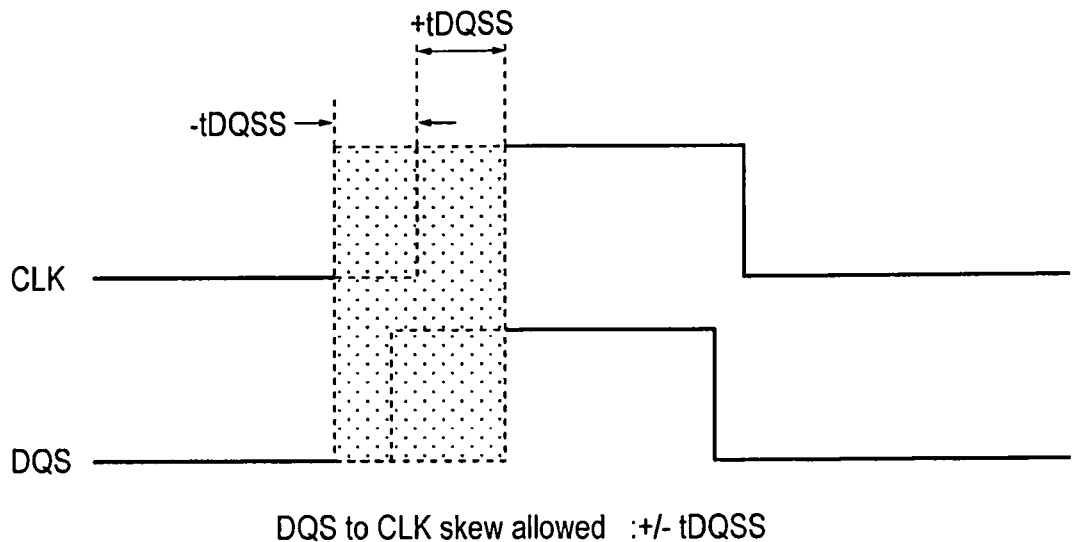
FIG. 4A illustrates the allowed skew between CLK and DQS.
Figure 4B:
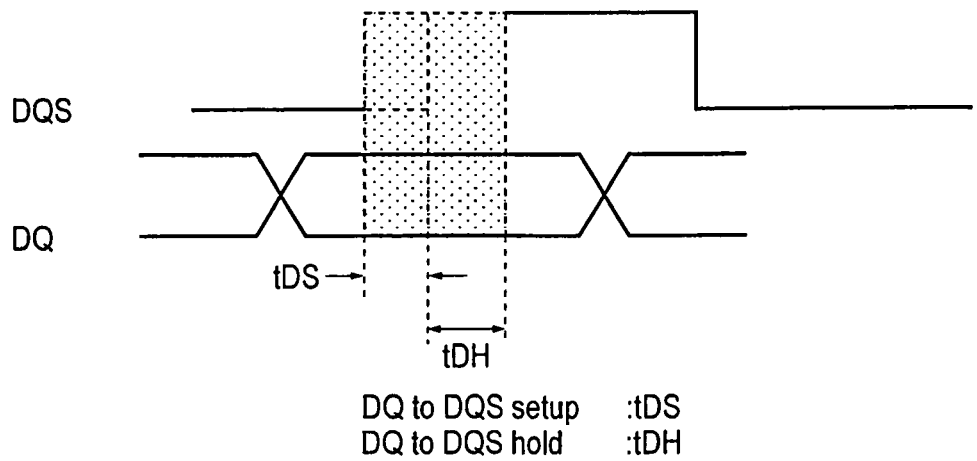
FIG. 4B illustrates the setup and hold times defined by the relative timing of DQS and DQ.

As shown in FIG. 4A, the system has a limited degree of tolerance to misalignment (skew) between DQS and CLK which is parameterised as +/−tDQSS. Equally, whilst the respective edge of the DQS signal should ideally fall relatively centrally within the DQ eye, there is a "set up" and "hold" period before and after this idea alignment in which the DQS edge can move and correct operation can still result. As shown in FIG. 4B, this variation is parameterised as tDS (set up) and tDH (hold).

Figure 5:
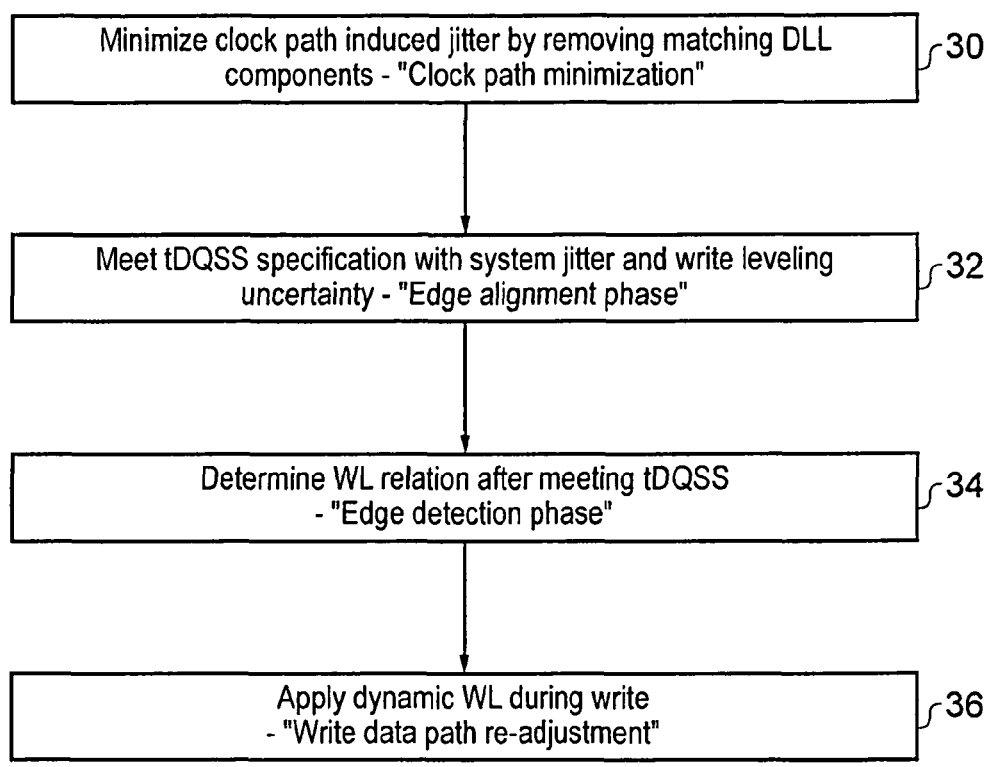
FIG. 5 shows a sequence of steps taken in one embodiment.

FIG. 5 shows a high-level view of four main steps which are carried out in the method of one embodiment. In a first step 30, entitled "clock path minimisation", DLL components provided on the clock path to enable a matching in timing between the clock (CLK) path and the data strobe (DQS) path are removed, thus reducing the jitter introduced to the system by the presence of these multiple components. At a next step 32, the "edge alignment phase", the relative alignment between the clock signal (CLK) and the data strobe signal on a selected data strobe path (DQS) is determined, in particular to meet the tDQSS requirement of the system (see FIG. 4A). Next, at step 34, the "edge detection phase" is carried out in which the absolute relation between the clock signal (CLK) and the data strobe signal (DQS) is determined, i.e. the specific clock edge (amongst multiple candidates) which is responsible for the alignment found is identified. Finally, on the basis of this identified clock edge, at step 36 (the "write data path readjustment phase"), the result of this write levelling process is used during the write procedure to dynamically select between alternative clock timings to correctly align with the identified clock edge.

Figure 6A:
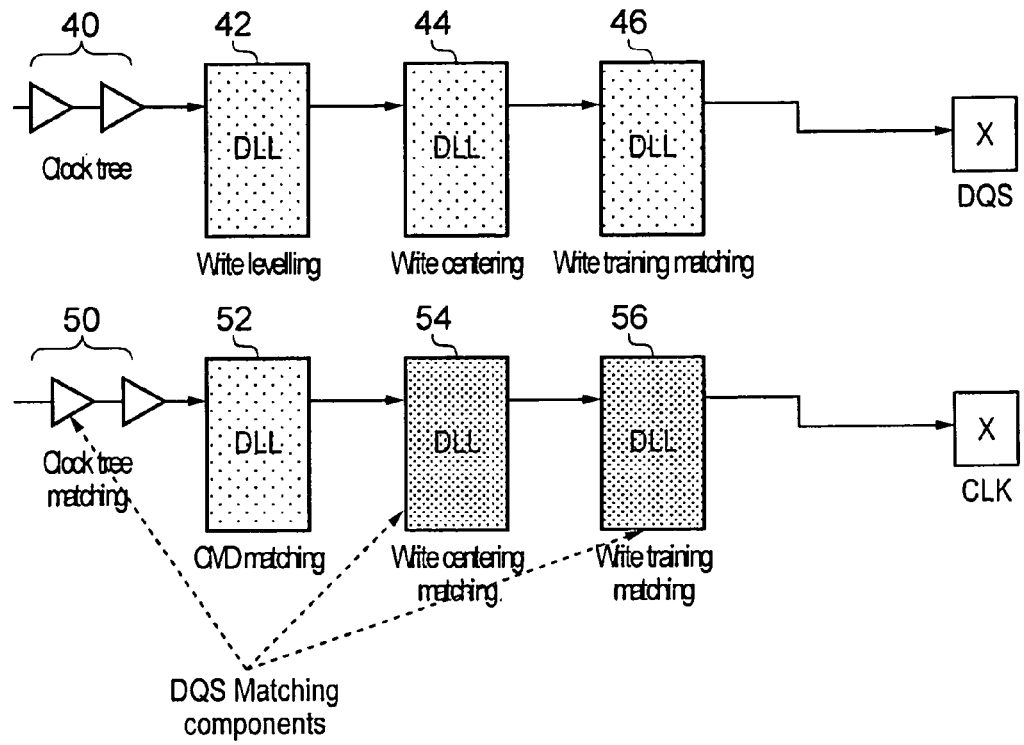
FIG. 6A schematically illustrates a clock path configuration in which delay components are provided to match the DQS path.

FIG. 6A schematically illustrates sets of components on a respective DQS path and on the clock path in a system such as that illustrated in FIG. 1. In particular, the DQS path comprises clock tree buffers 40, a write levelling DLL 42, a write centering DLL 44 and a write training matching DLL 46. These DLL components are comprised within the DLL unit 22 of each bytelane 18 in FIG. 1. Also shown in FIG. 6A are a set of components on the clock path which comprise clock tree buffers 50, command (CMD) matching DLL 52, write centering matching DLL 54 and write training matching DLL 56. As indicated in FIG. 6A, it should be noted that one of the clock tree buffers 50, the write centering matching DLL 54 and the write training matching DLL 56 have been provided such that the timing paths for DQS and CLK are matched to one another. However, whilst in the absence of the present techniques the matching of the DQS and CLK timing paths in this manner may previously have been desirable, each additional component present on the clock path adds to the system jitter.

Figure 6B:
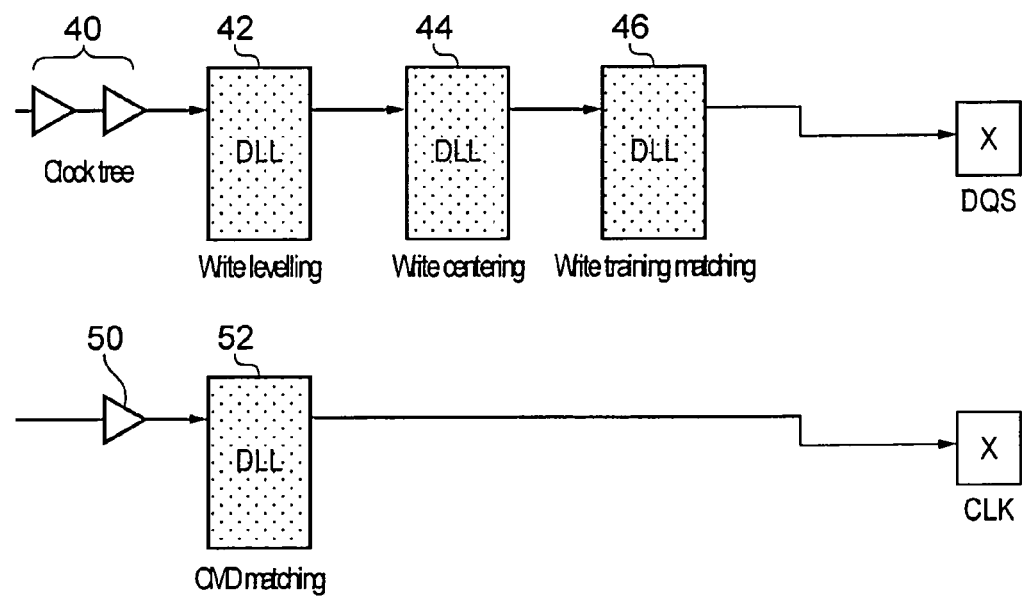
FIG. 6B schematically illustrates a configuration in which the DQS matching components have been removed from the clock path.

Accordingly, as shown in FIG. 6B, after the step 30 of FIG. 5 has been carried out, the "DQS matching components", namely one of the buffers 50 together with the write centring matching DLL 54 and the write training matching DLL 56 have been removed from the clock path. This improves the system jitter by removing these components, although necessarily also results in a situation in which the alignment between DQS and CLK has been further offset from one another. This aspect is addressed as described below.

Figure 6C:
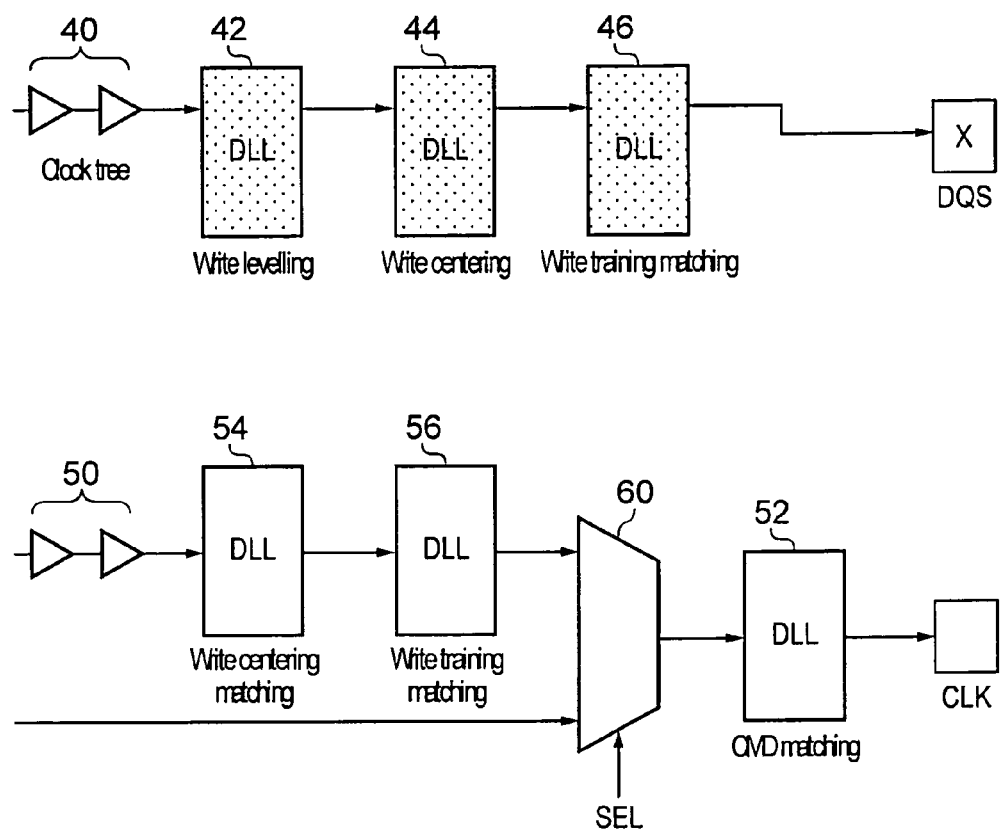
FIG. 6C schematically illustrates a configuration in which the DQS matching components on the clock path may be bypassed using a multiplexer.

FIG. 6C illustrates an alternative embodiment in which the write centering matching DLL 54 and the write training matching DLL 56 may be bypassed by appropriate setting of the selection signal SEL, which controls the multiplexer 60.

Figure 7:
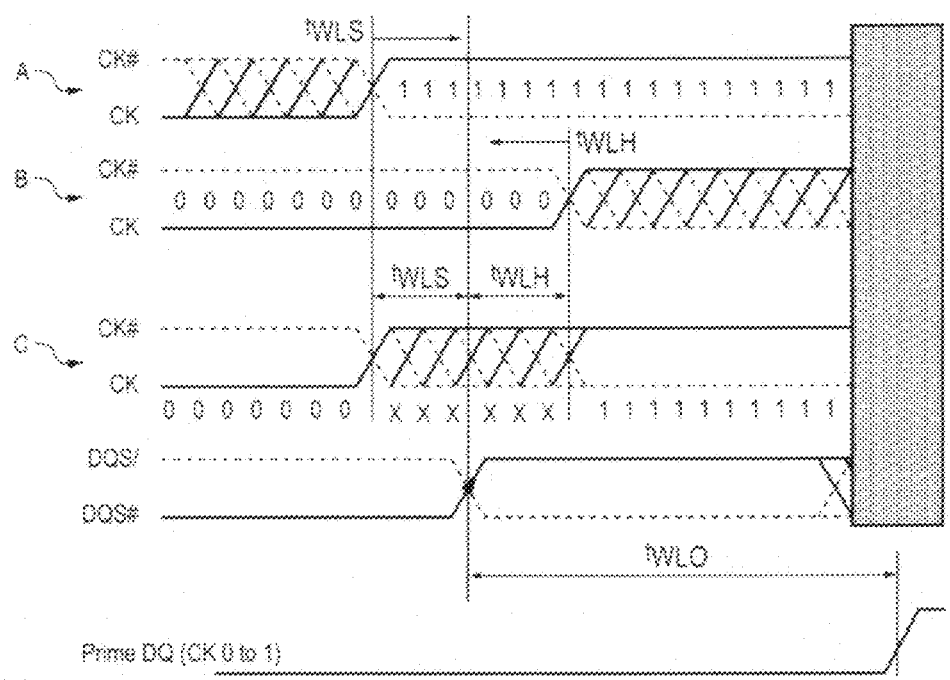
FIG. 7 schematically illustrates the relative timing of the clock and data strobe signal, the resulting DRAM response and the ambiguity of the DRAM response within the write levelling set up and hold time window.

FIG. 7 is a timing diagram showing a range of relative timings between the data strobe signal (DQS) and the clock signal (labelled "CK" in this figure), and the resulting write levelling response of the DRAM. As shown in the example "A", where the clock signal transitions in advance of the DQS signal, when the DRAM is put into write levelling mode and the memory module samples the input clock on the rising edge of DQS the response sent back to the memory controller on the DQ bus will be "1" whereas in example "B" where the rising edge of the clock signal falls after the DQS rising edge then the write levelling response of the DRAM module will be "0". The time difference between the respective clock rising edges and the DQS rising edge in the "A" and "B" examples of FIG. 7 also graphically illustrates the write levelling "set up" (tWLS) and write levelling "hold" (tWLH) times for this system. However, as illustrated by the example "C" in FIG. 7, a clock rising edge which falls within the boundaries defined by tWLS and tWLH will result in a write levelling response from the DRAM which is indeterminate. Accordingly, when seeking to align the clock and DQS signals, this aspect needs to be taken into account such that the process is not disrupted by misidentifying where the rising clock edge is with respect to the DQS rising edge. tWLO is the write levelling response time and prime DQ is the DQ bit which will carry the write levelling response.

FIGS. 8A-8D show a sequence of steps which are carried out in one embodiment when performing the "edge alignment phase" (see step 32 in FIG. 5). The process begins at step 100 where the write levelling and the write training matching analogue DLL (32 and 46 in FIG. 6A-6C) are set to zero. A new DQS strobe is launched and the DRAM response is loaded into a current response register in the respective bytelane 18 of the memory controller 12 (see FIG. 1). Then at step 102 the DLL step is incremented by 1, in this example this being done by stepping the write centering DLL 44 to the next 1/255 increment of a clock cycle. At step 104 another DQS strobe is launched and the content of a "current response" register is transferred to a "previous response" register (these being part of the bytelane control circuitry), whilst the DRAM response for this DQS strobe is loaded into the current response register. At step 106 it is determined if a transition is detected, i.e. if the content of the previous response register and the current response register differ. If they do not then the flow returns to step 102. When a transition is detected at step 106 then the flow proceeds to step 108 where a quarter cycle interval in DLL is oversampled (the number of oversampling points being user selectable between 7, 15, 31 and 63 times) and at step 110 the results of this oversampling are examined. If a majority of the oversampling results are "0" then it is determined (at step 112) that the previous transition was a falling edge transition and should be discarded and the flow returns to step 102. If however the oversampling gives a majority of "1" then (at step 114) it is determined that the previous transition was a rising edge transition and the process may proceed to the averaging process to determine the edge alignment offset on the basis of this rising edge averaged over a number of iterations to allow for system jitter.

Figure 8A:
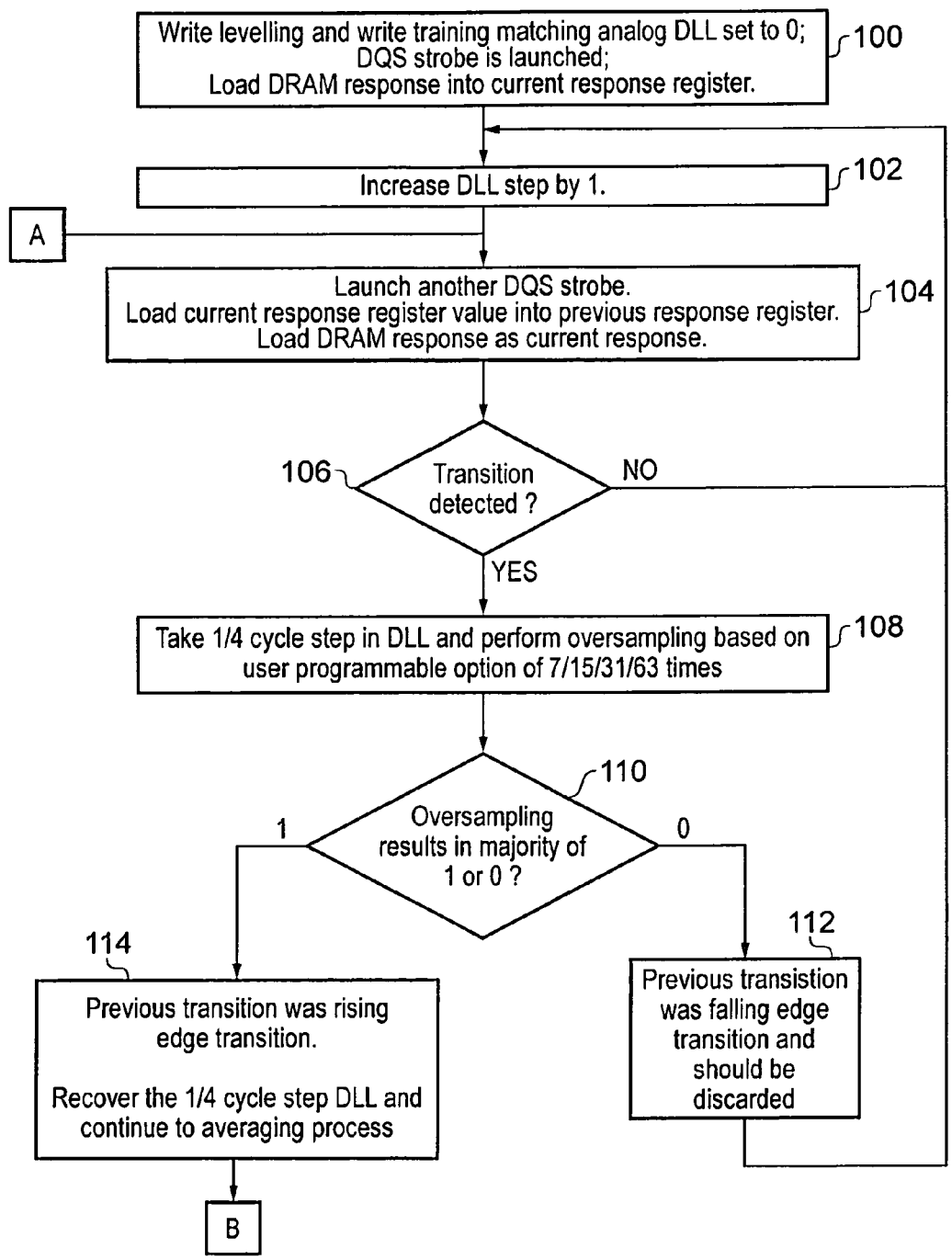
FIGS. 8A-8D schematically illustrate a sequence of steps which are taken according to the method of one embodiment.
Figure 8B:
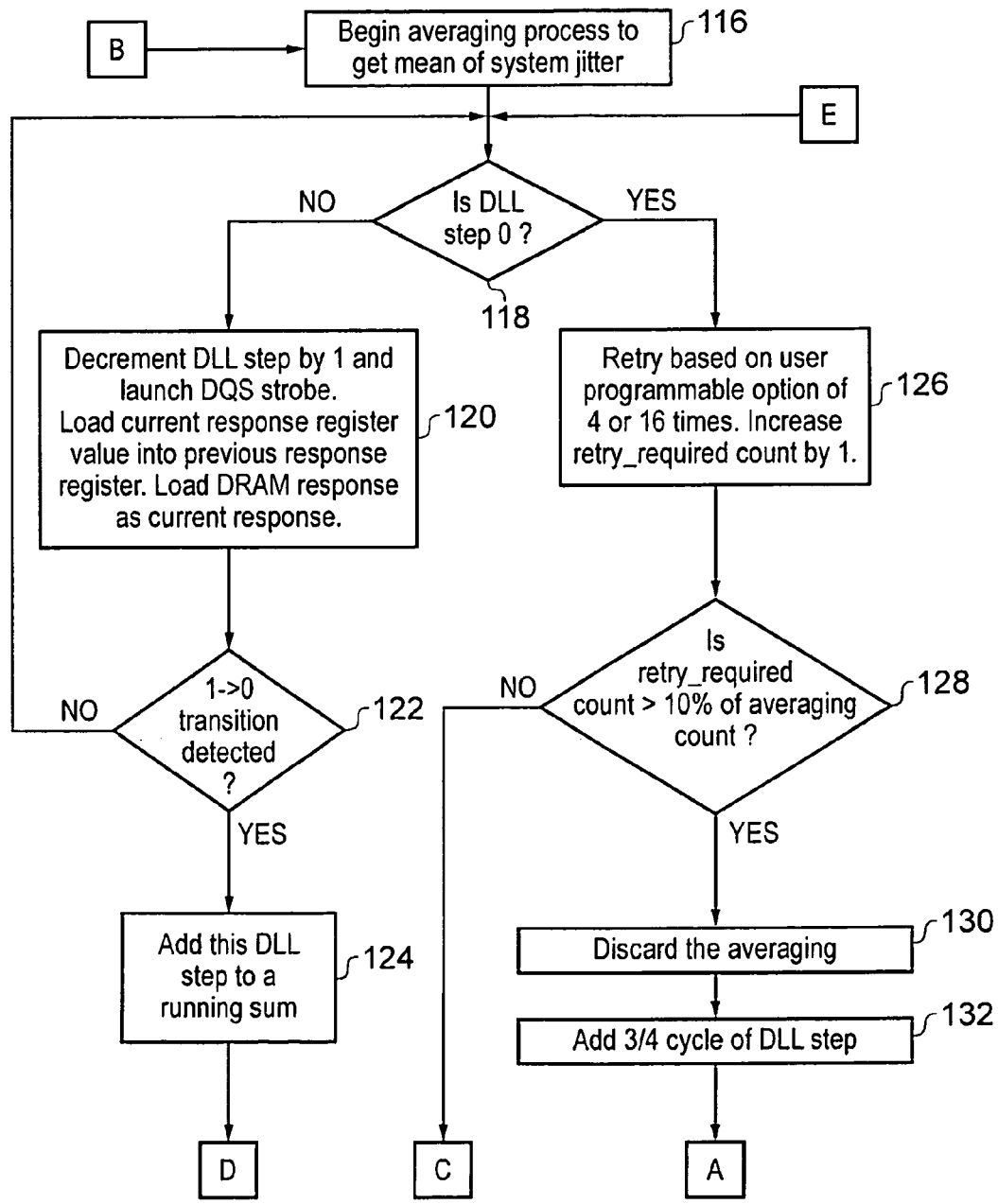
Figure 8C:
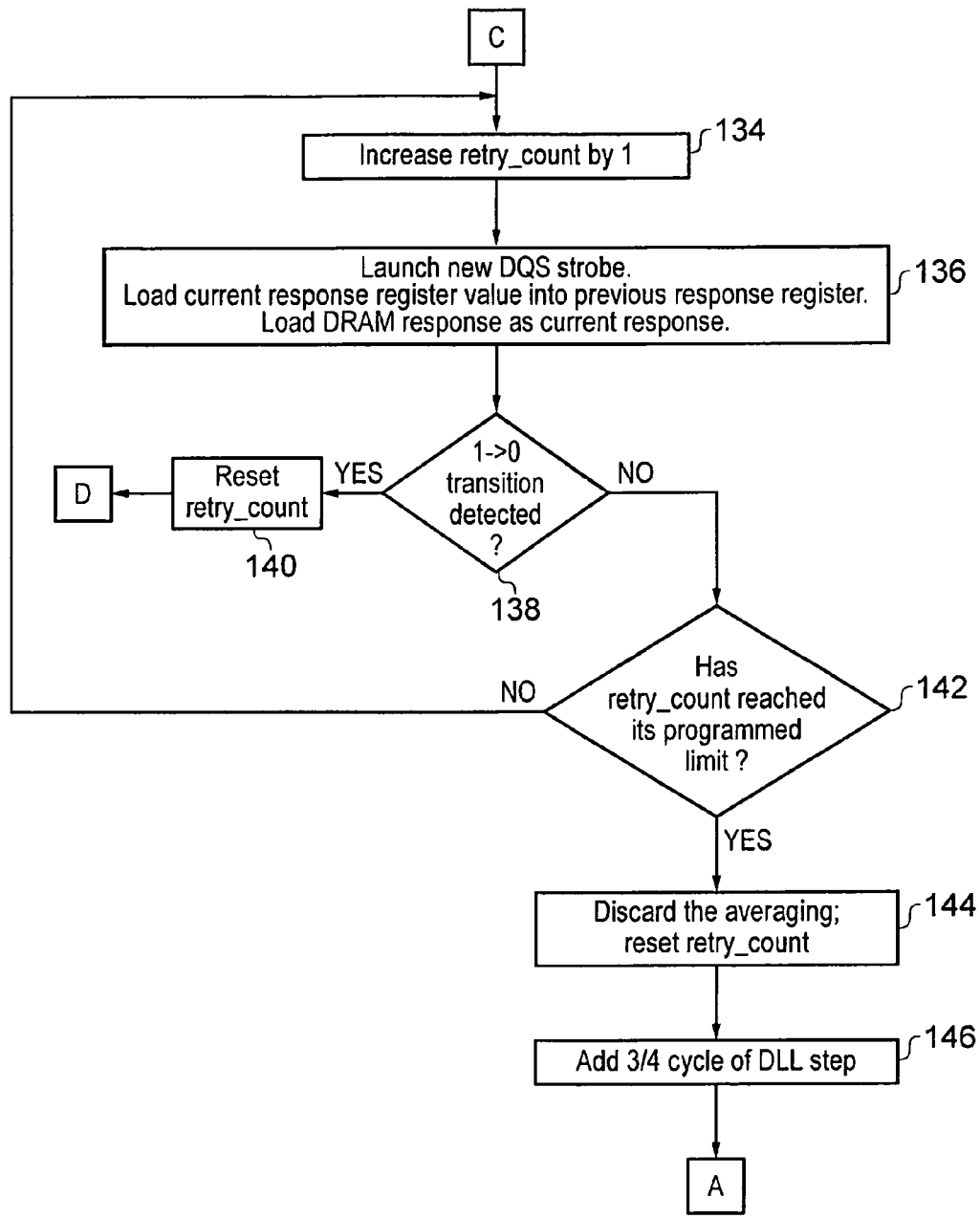
Figure 8D:
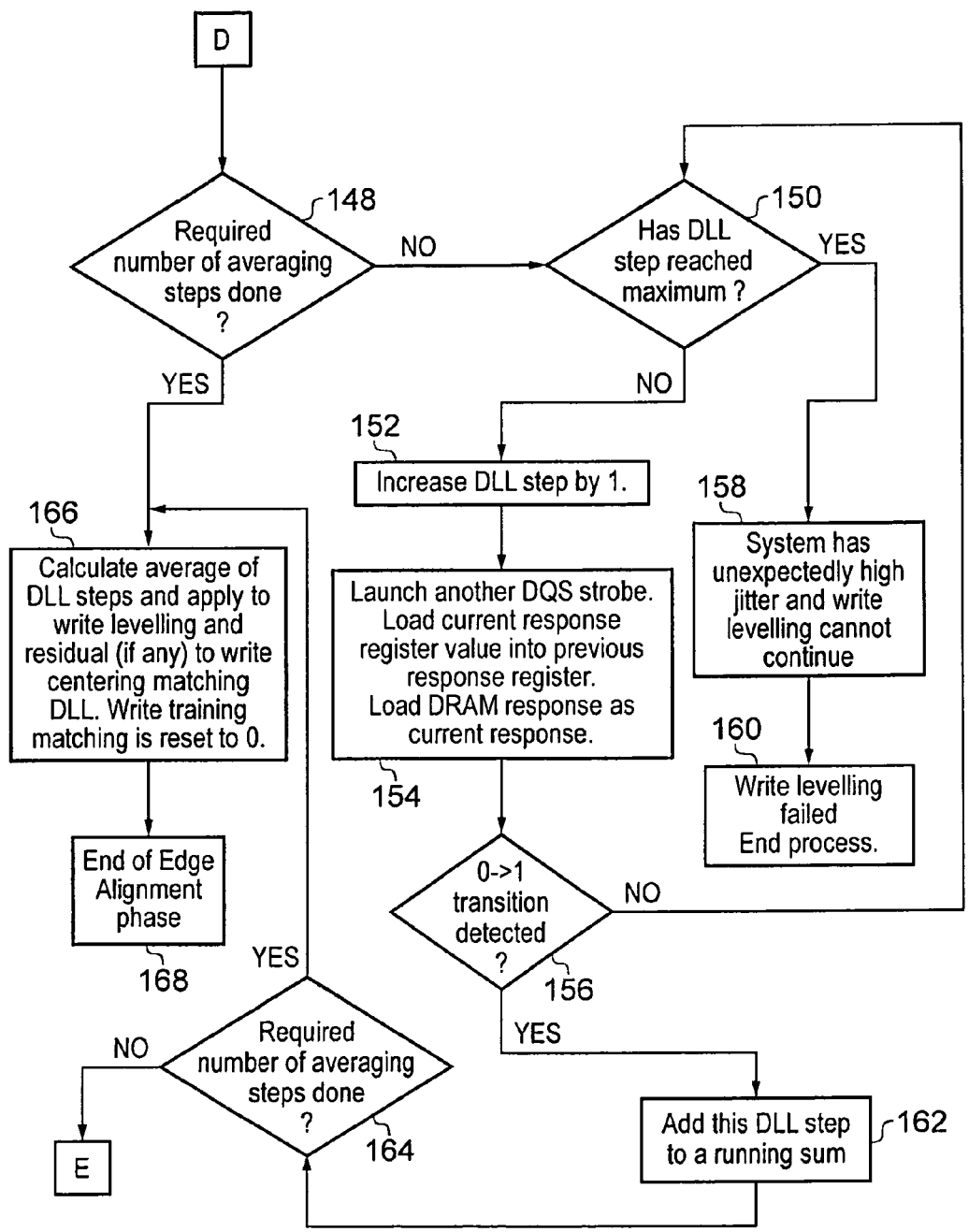

The flow continues from step 116 in FIG. 8B. In a first step of the averaging process (at step 118) it is determined if the DLL step is currently zero. If it is not then at step 120 the DLL is decremented by one and a DQS strobe is launched. The content of the current response register is transferred to the previous response register and the DRAM response is loaded as the current response. At step 122 it is then determined if a 1-to-0 transition is detected and if it is not then the flow returns to 118 and step 120 to continue decrementing the DLL step until such a transition is found (or the DLL reaches 0). When a 1-to-0 transition is detected at step 122, then at step 124 the current DLL step value is added to a running sum of the DLL steps found by the procedure and the flow proceeds to step 148 (see FIG. 8D) where it is checked if the required number of averaging steps are completed.

If further averaging steps are required then the flow proceeds to step 150 where it is determined if the DLL step has reached its maximum (in this embodiment this being a DLL offset corresponding to a complete clock cycle). If it has not reached this maximum then at step 152 the DLL step is now increased, such that the sweeping search for the transition is now proceeding in the opposite (i.e. increasing DLL) direction. At step 154 another DQS strobe is launched, the current content of the current response register value is loaded into the previous response register and the DRAM response is loaded as the current response. At step 156 it is determined if a 0-to-1 transition is detected and if it is not then the flow returns to step 150 and on to step 152 to in order to increment the DLL step and continue the search. If at step 150 the DLL reaches its maximum (i.e. an entire clock cycle has been swept without finding the rising edge) then it is determined that the system jitter is unexpectedly high (step 158) and write levelling cannot continue. The write levelling process aborts and ends at step 160. Conversely, when at step 156 the 0-to-1 transition is found, then at step 162 this value of DLL offset is added to a running sum of the DLL steps found by the procedure and at step 164 it is determined if the required numbered of averaging steps are completed.

If further averaging steps (in particular from this point: a further decrementing DLL sweep) is required then the flow returns to step 118 (see FIG. 8B) and (via step 120 and 122) the DLL step is decremented until the transition is found whereafter (from step 148) if further averaging steps are still required than an increasing DLL sweep is performed (step 150-156) and so on. Thus alternating phases of increasing the DLL step and decreasing the DLL step and performed to scan up and down and identify the transition point in each direction.

Returning to FIG. 8B, in the event that it is determined at step 118 that the DLL step has reached zero then a retry procedure is carried out. This is performed because the DLL step has been decremented all the way to zero without the rising edge having been identified. The retry process begins at step 126 where the number of retries for this iteration is determined based on a user programmable option of 4 or 16 times. A counter retry_required is incremented to monitor the number of times which this retry process is entered for a given averaging process. The number of performances of the retry process is limited with respect to the averaging count (i.e. the number of measurements used in the averaging calculation) and if the retry required count exceeds 10% of the averaging count then the flow proceeds to step 130 and the averaging is discarded. At step 132 three quarters of a cycle of DLL step is added and the flow returns to step 104 (see FIG. 8A). If the number of times the retry process has been entered does not exceed the 10% limit at step 128 then the flow proceeds to step 134 (see FIG. 8C). Here a counter retry_count is incremented to count the number of retry attempts within each retry process and at step 136 a new DQS strobe is launched and the current response register value is loaded into the previous response register and the DRAM response is loaded as the current response. At step 138 it is determined if a 1-to-0 transition is detected. If it is then the retry_count counter is reset at step 140 and the flow proceeds to step 148 (see FIG. 8D). If however at step 138 the 1-to-0 transition is not detected then at step 142 it is determined if retry_count has reached its programmed limit (i.e. the user programmable option of 4 or 16 retry attempts) and whilst this limit is not exceeded the flow returns to step 134. If the retry count reaches this limit then at step 144 the averaging is discarded, retry_count is reset and at step 146 three quarters of a cycle of DLL offset is added and the flow returns to step 104 see FIG. 8A).

Finally, once the required number of averaging steps is complete (determined at either 148 or 164—see FIG. 8D) then the flow proceeds to step 166 where the average of the DLL steps found to correspond to the valid transitions is determined (by dividing the DLL step sum by the number of averaging values). This determined value is then applied to the write levelling DLL and any residual is added to the write centering matching DLL. Finally the write training matching DLL is reset to zero. The edge alignment phase completes at step 168.

Figure 9A:
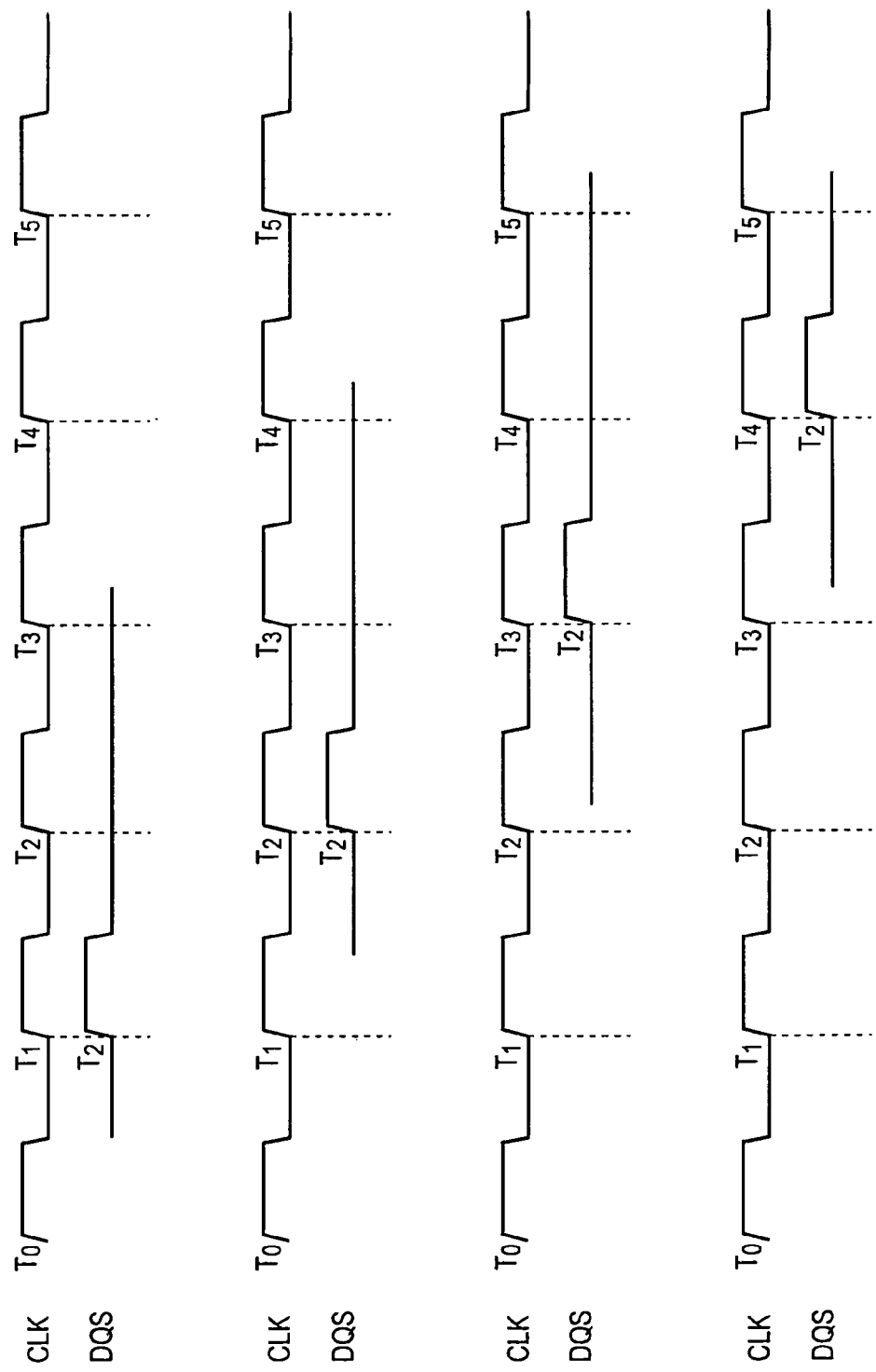
FIG. 9A schematically illustrates the edge alignment of the CLK and DQS signals after the edge alignment phase of the method in one embodiment.

Once the relative alignment of CLK and DQS has been performed in this manner then whilst the relative alignment DQS has been achieved, in absolute terms the rising edge of the DQS strobe could have been aligned with any one of a number of clock rising edges as is schematically illustrated in the timing diagrams shown in FIG. 9A. This "edge relation" is important because it depends on the DRAM memory topology (point-to-point or DIMM) as well as the PVT condition and system jitter. Accordingly, whilst the above described edge alignment procedure meets the specification for satisfying tDQSS, it will not satisfy the overall write levelling requirement since this alignment may vary each time the write levelling is performed and a different edge relation could result. Hence, as shown in FIG. 9B, an iterative masking process is carried out to determine the write levelling relation after meeting tDQSS (this being the edge detection phase).

Figure 9B:
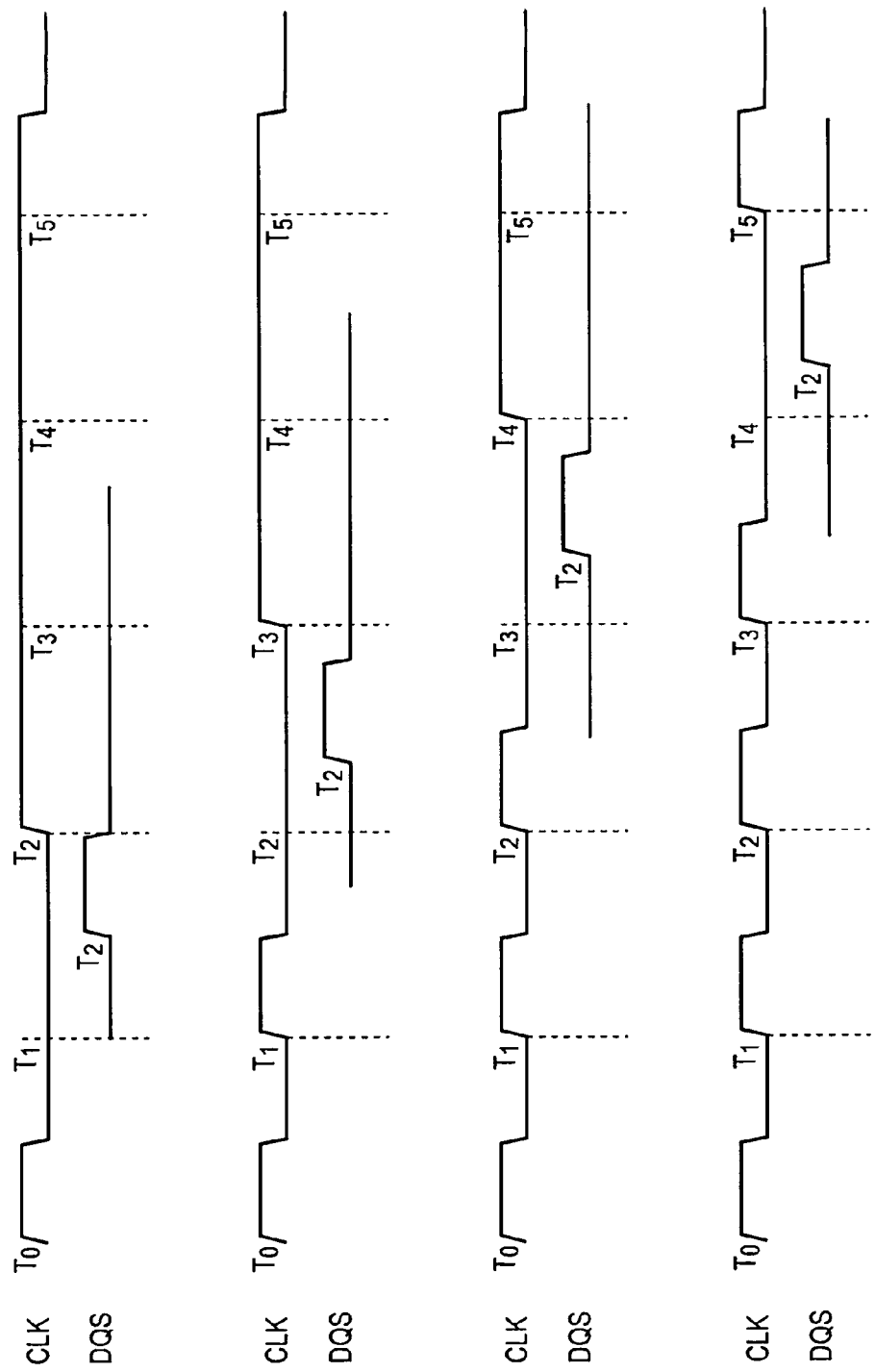
FIG. 9B schematically illustrates the identification of the particular clock cycle with which the DQS edge relationship is aligned in one embodiment.
Figure 10:
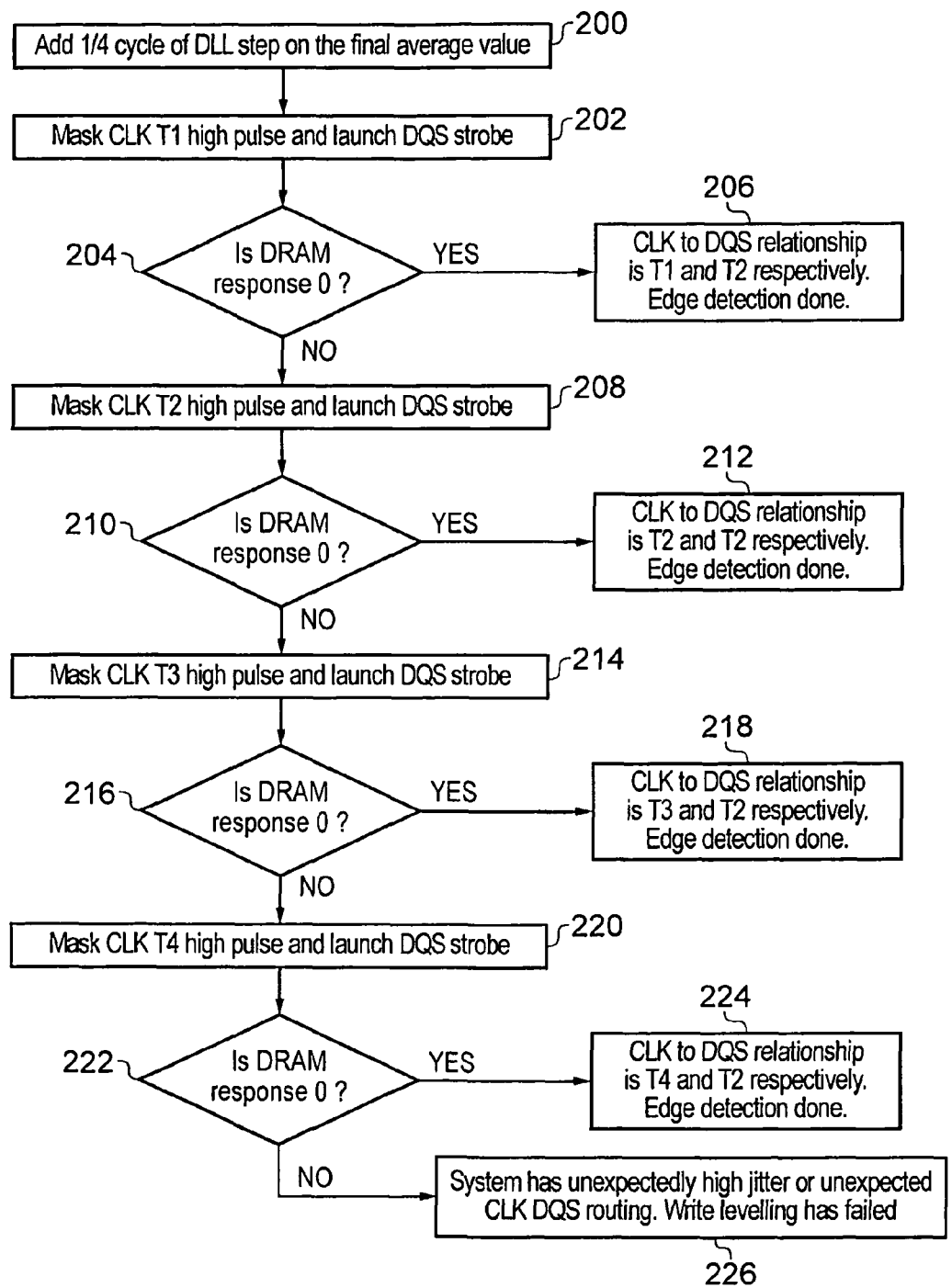
FIG. 10 schematically illustrates a sequence of steps which are taken to identify the CLK to DQS relationship in one embodiment.

The steps carried out in one embodiment corresponding to FIG. 9B are shown in FIG. 10, which begin at step 200 where a quarter cycle is added to the DLL step determined as the final average value. As can be seen by comparison of FIGS. 9A and 9B this positions the rising edge of the DQS strobe in a position relative to the respective masked clock signal such that a reliable DRAM response may be obtained. Then at step 202 the T1 high pulse is masked and the DQS strobe is launched. If this results in a DRAM response of zero (step 204) then it is concluded (at step 206) that the CLK/DQS relationship is between T1 and T2 respectively and the edge detection process is complete.

If however the DRAM response at step 204 is not zero then next (step 208 and 210) it is determined if masking the clock T2 high pulse results in a DRAM response of zero. If it does, then it is concluded (at step 212) that the CLK/DQS relationship is between T2 and T2 respectively and the edge detection process is complete.

If however the DRAM response at step 210 is not zero then next (step 214 and 216) it is determined if masking the clock T3 high pulse results in a DRAM response of zero. If it does, then it is concluded (at step 218) that the CLK/DQS relationship is between T3 and T2 respectively and the edge detection process is complete.

If however the DRAM response at step 216 is not zero then next (step 220 and 222) it is determined if masking the clock T4 high pulse results in a DRAM response of zero. If it does, then it is concluded (at step 224) that the CLK/DQS relationship is between T4 and T2 respectively and the edge detection process is complete.

Finally, if the DRAM response at step 222 is also not a zero then the edge detection phase has failed due to unexpectedly high jitter or unexpected CLK/DQS routing and the process ends in failure at step 226.

Figure 11:
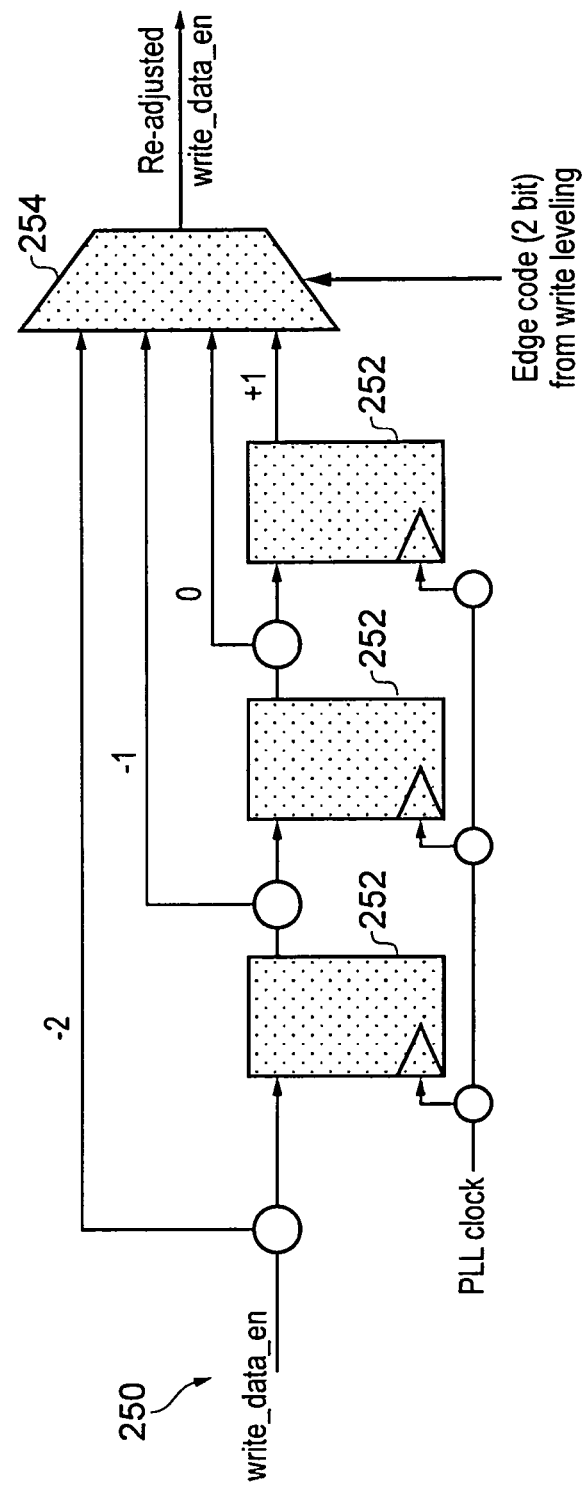
FIG. 11 schematically illustrates the selection between four alternative write data enable signals in order to implement the selection of an identified CLK/DQS alignment in one embodiment.
Figure 12A:
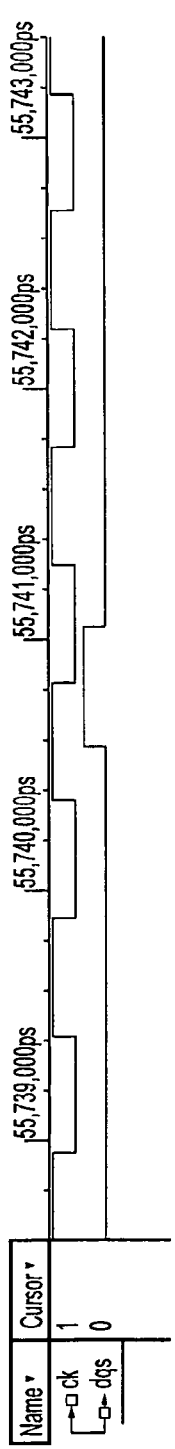
FIG. 12A shows a simulation of the CLK/DQS alignment before write levelling is carried out.
Figure 12B:
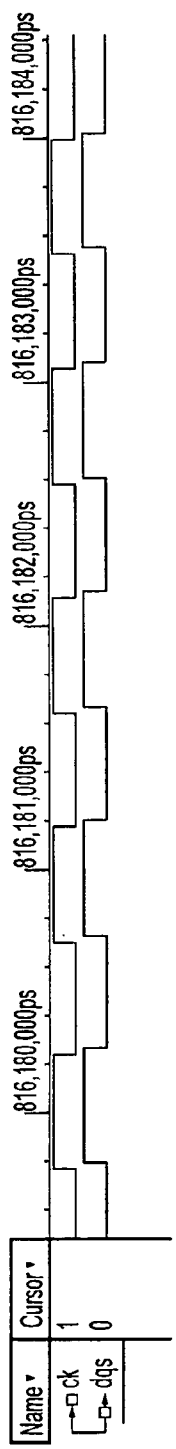
FIG. 12B shows a simulation of the CLK/DQS alignment after write levelling.
Figure 12C:
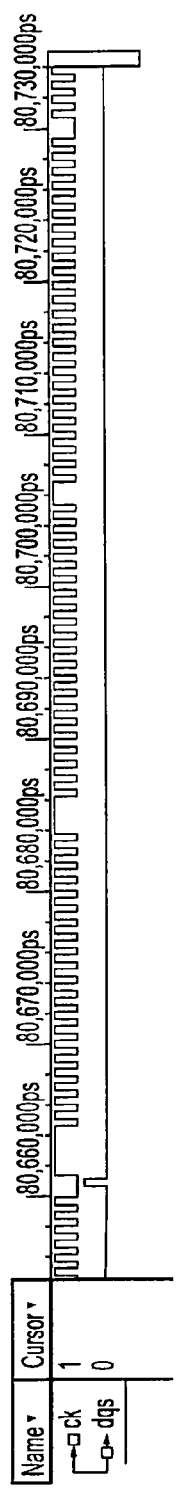
FIG. 12C shows a simulation of the a CLK shaping step in one embodiment.

FIG. 11 schematically illustrates how the edge detection performed according the procedure shown in FIG. 10 can be used in one embodiment. Here, the result of the edge detection is used to select between four different alternatives for a write data enable signal 250 (write_data_en). Three concatenated flops 252 are used to generate three further versions of the write data enable signal respectively delayed by a further clock cycle each and a two bit edge code from the write levelling output is used to select between these at multiplexer 254. Hence, a "readjusted" data write enable signal is generated which adjusts for the clock to DQS so CLK to DQS relationship determined FIGS. 12A-12B illustrate simulations of CLK and DQS alignment before and after write levelling. FIG. 12A shows a single DQS strobe as used in the above-described alignment procedure and FIG. 12B shows the full clock signal that may result from the above-described alignment procedure. FIG. 12C shows a CLK shaping step showing the clock masking.

Although particular embodiments of the invention have been described herein, it will be apparent that the invention is not limited thereto, and that many modifications and additions may be made within the scope of the invention. For example, various combinations of the features of the following dependent claims could be made with the features of the independent claims without departing from the scope of the present invention.

We claim:

1. A method of aligning a clock signal and a data strobe signal in a system comprising a memory controller and a memory, the method comprising the steps of:
putting said memory into a write levelling mode;
incrementing an alignment delay applied to said data strobe signal until a transition point occurs at which a response of said memory to issuance of said data strobe signal transitions to an inverse state;
performing an oversampling of said response of said memory over a selected interval following said transition point;
repeating said steps of incrementing and performing an oversampling until, for a selected alignment delay, a majority of results of said oversampling is in said inverse state;
performing a cycle alignment detection procedure to determine an identified clock cycle of a plurality of adjacent cycles of said clock signal, said identified clock cycle responsible for said transition point; and
applying said selected alignment delay to said data strobe signal and applying a clock cycle selection to a data path in said system to match said identified clock cycle.

2. The method as claimed in claim 1, further comprising a clock path reduction step, said clock path reduction step comprising amending a clock path which carries said clock signal to reduce a delay inherent in propagating said clock signal along said clock path.

3. The method as claimed in claim 2, wherein said clock path reduction step comprises removing selected components from said clock path, wherein said selected components have matching counterparts on a data strobe path which carries said data strobe signal.

4. The method as claimed in claim 2, wherein said clock path reduction step comprises enabling one of a plurality of alternative routes for said clock path.

5. The method as claimed in claim 1, further comprising an average alignment delay determination step, said average alignment delay determination step comprising iteratively re-determining said transition point and calculating an average alignment delay.

6. The method as claimed in claim 5, wherein said iteratively re-determining said transition point comprises alternate phases of:
i) increasing said alignment delay to identify said transition point at which said response of said memory to issuance of said data strobe signal transitions to said inverse state; and
ii) decreasing said alignment delay to identify said transition point at which said response of said memory to issuance of said data strobe signal transitions to an inverse of said inverse state.

7. The method as claimed in claim 6, wherein said alignment delay is not reset between said alternate phases.

8. The method as claimed in claim 6, wherein, if said phase of increasing said alignment delay reaches a maximum alignment delay without said transition point being identified then said iteratively re-determining said transition point is determined to have failed.

9. The method as claimed in claim 6, wherein, if said phase of decreasing said alignment delay reaches a minimum alignment delay without said transition point being identified, then a current iteration of iteratively re-determining said transition point is retried.

10. The method as claimed in claim 9, wherein, if a number of retried iterations exceeds a predetermined proportion of a number of successful iterations of said average alignment delay determination step, said average alignment delay determination step is determined to have failed.

11. The method as claimed in claim 10, wherein, if said average alignment delay determination step is determined to have failed, said average alignment delay determination step is reinitiated after adding an offset to said alignment delay.

12. The method as claimed in claim 1, wherein said cycle alignment detection procedure comprises iteratively masking clock cycles of said plurality of adjacent cycles to determine said identified clock cycle which is responsible for said transition point on the basis of a change in said response of said memory.

13. The method as claimed in claim 12, wherein said cycle alignment detection procedure comprises adding a partial clock cycle to said selected alignment delay prior to iteratively masking said clock cycles.

14. The method as claimed in claim 1, wherein said cycle alignment detection procedure comprises comparing said selected alignment delay to a user defined threshold and determining said identified clock cycle based on a result of said comparing.

15. The method as claimed in claim 1, wherein said applying said clock cycle selection to said data path to match said identified clock cycle comprises selecting between a plurality of differently timed enable signals.

16. The method as claimed in claim 1, wherein said memory is a DDR 3 memory system.

17. A computer program product storing in a non-transient fashion a computer program configured to cause the execution of the method as claimed in claim 1.

18. Apparatus comprising a memory controller and a memory, the apparatus comprising:
a control unit configured to put said memory into a write levelling mode;
an alignment delay determination unit configured to increment an alignment delay applied to a data strobe signal until a transition point occurs at which a response of said memory to issuance of said data strobe signal transitions to an inverse state;
an oversampling unit configured to perform an oversampling of said response of said memory over a selected interval following said transition point,
said alignment delay determination unit and said oversampling unit configured to repeat said incrementing and performing an oversampling until, for a selected alignment delay, a majority of results of said oversampling is in said inverse state; and
a cycle alignment detection unit configured to perform a cycle alignment detection procedure to determine an identified clock cycle of a plurality of adjacent cycles of said clock signal which is responsible for said transition point,
wherein said control unit is configured to apply said selected alignment delay to said data strobe signal and to apply a clock cycle selection to a data path to match said identified clock cycle.

19. Apparatus comprising a memory controller and a memory, the apparatus comprising:
control means for putting said memory into a write levelling mode;
alignment delay determination means for incrementing an alignment delay applied to a data strobe signal until a transition point occurs at which a response of said memory to issuance of said data strobe signal transitions to an inverse state;
oversampling means for performing an oversampling of said response of said memory over a selected interval following said transition point means configured to repeat said incrementing and performing an oversampling until, for a selected alignment delay, a majority of results of said oversampling is in said inverse state; and
cycle alignment detection means for performing a cycle alignment detection procedure to determine an identified clock cycle of a plurality of adjacent cycles of said clock signal which is responsible for said transition point,
wherein said control means is configured to apply said selected alignment delay to said data strobe signal and to apply a clock cycle selection to a data path to match said identified clock cycle.

* * * * *